United States Patent [19]

Nakashima et al.

[11] Patent Number: 5,633,536
[45] Date of Patent: May 27, 1997

[54] PRESS CONTACT TYPE SEMICONDUCTOR DEVICE

[75] Inventors: Nobuhisa Nakashima, Fukuoka; Yuzuru Konishi, Tokyo; Tokumitsu Sakamoto, Fukuoka, all of Japan

[73] Assignee: Mitsubishi Denki Kabushiki Kaisha, Tokyo, Japan

[21] Appl. No.: 567,524

[22] Filed: Dec. 5, 1995

[30] Foreign Application Priority Data

Jun. 20, 1995 [JP] Japan ................... 7-153484

[51] Int. Cl.$^6$ .............. H01L 23/48; H01L 23/52; H01L 29/40
[52] U.S. Cl. .............. 257/785; 257/181; 257/688
[58] Field of Search .............. 257/171, 181, 257/688, 785

[56] References Cited

U.S. PATENT DOCUMENTS

| | | | |
|---|---|---|---|
| 3,586,932 | 6/1971 | Kokosa | 317/235 R |
| 3,931,635 | 1/1976 | Sundstroem | 257/674 |
| 5,371,386 | 12/1994 | Tokunoh et al. | 257/181 |

FOREIGN PATENT DOCUMENTS

| | | |
|---|---|---|
| 0013815 | 8/1980 | European Pat. Off. . |
| 1215028 | 8/1989 | Japan . |
| 2297409 | 12/1990 | Japan . |
| 1217964 | 1/1971 | United Kingdom . |
| 1482297 | 8/1977 | United Kingdom . |
| 2057762 | 4/1981 | United Kingdom . |

Primary Examiner—Sara W. Crane
Assistant Examiner—Douglas Wille
Attorney, Agent, or Firm—Oblon, Spivak, McClelland, Maier & Neustadt, P.C.

[57] ABSTRACT

Provided is a press contact type semiconductor device which improves the shape of an insulator formed along an outer peripheral edge and a major surface of a semiconductor substrate, simplifies alignment of an anode heat compensator and a cathode heat compensator, causes no biting, causes no separation in molding, and has excellent heat dissipation. In the press contact type semiconductor device, the inner periphery of a ring-shaped insulator (22) which is formed along an edge of the overall periphery and a major surface of a semiconductor substrate (6) provided with a P-N junction in its interior comprises a tapered portion (22a) along the inner peripheral direction and a vertical portion (22b) forming a perpendicular inner peripheral diameter which is continuous to this tapered portion (22a).

20 Claims, 7 Drawing Sheets

PRESS CONTACT TYPE SEMICONDUCTOR DEVICE

BACKGROUND OF THE INVENTION

1. Field of the Invention

The present invention relates to an alloy-free press contact type semiconductor device which is employed for power use or the like, and more particularly, it relates to the shape of an insulator which is provided on the outer peripheral part of a semiconductor substrate.

2. Description of the Background Art

FIG. 10 is a sectional view showing a conventional alloy-free press contact type semiconductor device, which is described in Japanese Patent Laying-Open Gazette No. 1-215028 (1989), for example. Referring to the figure, numeral 1 denotes a cathode copper block, numeral 2 denotes an anode copper block, numeral 3 denotes a casing consisting of an insulator such as ceramic, numeral 4 denotes an anode heat compensator, numeral 6 denotes a semiconductor substrate, numeral 7 denotes an insulator consisting of silicone rubber or the like, numeral 8 denotes a spring, numeral 9 denotes a gate lead, numeral 10 denotes a gate support rod, and numeral 11 denotes an insulating varnish. The semiconductor substrate 6 is provided in its interior with a P-N junction, and its outer peripheral edge is insulated by the insulating varnish 11, while high voltage resistance is attained by the insulator 7.

The insulator 7 is adapted to increase a creeping distance for attaining high voltage resistance, while positioning the cathode and anode heat compensators 5 and 4 with respect to the semiconductor substrate 6.

After the respective parts are assembled as shown in FIG. 10, the cathode and anode copper blocks 1 and 2 are pressurized to bring the respective parts into press contact with each other, for attaining prescribed electrical properties.

FIGS. 11 and 12 are sectional views showing a portion around the insulator 7 which is formed on the outer periphery of the semiconductor substrate 6 in an enlarged manner. Referring to FIG. 11, an inner peripheral surface 12 of the insulator 7 is formed to be perpendicular to the surface of the semiconductor substrate 6. As shown in FIG. 12, the insulator 7 is cast-molded and hardened/fixed through upper and lower molds 15 and 16, and thereafter released from the molds. In such mold releasing, separation 17 is disadvantageously caused in a bonded surface of the inner periphery. When a tapered part 13 is formed on the inner periphery of the insulator 7 as shown in FIG. 13 in order to solve this problem, the cathode heat compensator 5 or the anode heat compensator 4 goes aground on the inner peripheral edge of the insulator 7, defines a bite portion 18, and comes into half-contact with the semiconductor substrate 6.

While FIG. 10 shows a structure which is provided with a gate at the center, a similar problem also arises in the case of the so-called outer peripheral ring gate structure which is provided with the gate on the outer periphery of the semiconductor substrate 6.

In order to dissipate heat which is generated when the press contact type semiconductor device is driven, on the other hand, it is effective to maximize the diameters of the anode and cathode heat compensators 4 and 5. When a foreign matter 40 is present on the outer periphery of the semiconductor substrate 6 as shown in FIG. 14, however, a short is inevitably caused across a cathode electrode 19 and a gate electrode 20 of the semiconductor substrate 6 through the cathode heat compensator 5, and hence the diameter of the cathode heat compensator 5 cannot be increased. Thus, it is disadvantageously difficult to position the small cathode heat compensator 5 although the large-diameter anode heat compensator 4 can be readily positioned.

SUMMARY OF THE INVENTION

According to a first aspect of the present invention, a p^@ess contact type semiconductor device comprises a semiconductor substrate, which is provided with a P-N junction in its interior, having first and second major surfaces, a ring-shaped insulator which is formed along an edge of the overall periphery and the first and second major surfaces of the semiconductor substrate, a first heat compensator which is in contact with the first major surface, and a second heat compensator which is in contact with the second major surface, and the insulator is provided on its inner periphery with an inner peripheral tapered portion and a vertical portion, which is continuous to the tapered portion, forming an inner peripheral diameter and is substantially perpendicular to the semiconductor substrate.

According to a second aspect of the present invention, the inner peripheral diameter of a portion of the insulator along the first major surface is larger than that of a portion along the second major surface.

According to a third of the present invention, a press contact type semiconductor device comprises a semiconductor substrate, which is provided with a P-N junction in its interior, having first and second major surfaces, a ring-shaped insulator which is formed along an edge of the overall periphery and the first and second major surfaces of the semiconductor substrate, a first heat compensator which is in contact with the first major surface, and a second heat compensator which is in contact with the second major surface, and the inner peripheral diameter of a portion of the insulator along the first major surface is larger than that of a portion along the second major surface.

According to a fourth aspect of the present invention, at least one concave portion is formed on the surface of a portion of the insulator which is formed along the first major surface and/or the second major surface.

According to a fifth aspect of the present invention, a ring-shaped concave portion is formed on the overall periphery of the surface of a portion of the insulator which is formed along the edge.

According to a sixth aspect of the present invention, a concave portion having a diameter which is substantially identical to the inner peripheral diameter of a portion formed on the first major surface is formed on the inner periphery of a portion of the insulator which is formed along the second major surface.

According to an eighth aspect of the present invention, a press contact type semiconductor device comprises a semiconductor substrate, which is provided with a P-N junction in its interior, having first and second major surfaces, a ring-shaped insulator which is formed along an edge of the overall periphery and the first and second major surfaces of the semiconductor substrate, a first heat compensator which is in contact with the first major surface, and a second heat compensator which is in contact with the second major surface, and a ring-shaped groove is formed coaxially with the semiconductor substrate in portions of the first and second major surfaces contacting the insulator.

According to a ninth aspect of the present invention, a press contact type semiconductor device comprises a semiconductor substrate, which is provided with a P-N junction in its interior, having first and second major surfaces, a ring-shaped insulator which is formed along an edge of the overall periphery and the first and second major surfaces of the semiconductor substrate, a first heat compensator which is in contact with the first major surface, and a second heat compensator which is in contact with the second major surface, and at least one concave portion is formed on the surface of a portion of the insulator which is formed along the first major surface and/or the second major surface.

According to a tenth aspect of the present invention, a press contact type semiconductor device comprises a semiconductor substrate, which is provided with a P-N junction in its interior, having first and second major surfaces, a ring-shaped insulator which is formed along an edge of the overall periphery and the first and second major surfaces of the semiconductor substrate, a first heat compensator which is in contact with the first major surface, and a second heat compensator which is in contact with the second major surface, and a ring-shaped concave portion is formed on the overall periphery of the surface of a portion of the insulator which is formed along the edge.

According to an eleventh aspect of the present invention, a ring-shaped groove is formed coaxially with the semiconductor substrate in a position defining the insulator by the first and second major surfaces of the semiconductor substrate.

According to the first aspect of the present invention, the vertical portion reliably positions the heat compensator, no biting is caused, and resistance in mold releasing is relaxed by the tapered portion also when the insulator is molded, so that the insulator is not separated along a surface bonded to the semiconductor substrate.

According to the second aspect of the present invention, the vertical portion reliably positions the heat compensator, no biting is caused, and resistance in mold releasing is relaxed by the tapered portion also when the insulator is molded, so that the insulator is not separated along a surface bonded to the semiconductor substrate, while the diameter of the heat compensator which is in contact with the first major surface can be increased to improve heat dissipation since the inner peripheral diameter of the insulator which is formed along the first major surface of the semiconductor substrate is larger than that of the insulator formed on the second major surface.

According to the third aspect of the present invention, the diameter of the heat compensator which is in contact with the first major surface can be increased to improve heat dissipation since the inner peripheral diameter of the insulator which is formed along the first major surface of the semiconductor substrate is larger than that of the insulator formed on the second major surface.

According to the fourth or ninth aspect of the present invention, the concave portion is formed on the surface of the insulator which is formed along the first major surface and/or the second major surface, whereby heat which is stored in the insulator can be efficiently dissipated.

According to the fifth or tenth aspect of the present invention, the ring-shaped concave portion is formed on the overall periphery of the surface of the insulator which is formed along the edge of the semiconductor substrate, whereby the surface area of the insulator is so increased that heat which is stored in the insulator can be efficiently dissipated and voltage resistance is improved since the creeping distance is increased.

According to the sixth aspect of the present invention, the concave portion having the diameter which is substantially identical to the inner peripheral diameter of the insulator formed on the first major surface is formed on the inner periphery of the insulator formed along the second major surface of the semiconductor substrate, whereby no flash is caused in molding and the heat compensator can be prevented from being in half-contact the semiconductor substrate.

According to the seventh aspect of the present invention, the outer diameter of the first heat compensator is rendered larger than that of the second heat compensator by at least 5%, whereby heat dissipation efficiency can be improved.

According to the eighth or eleventh aspect of the present invention, the ring-shaped groove is formed coaxially with the semiconductor substrate in portions of the first and second major surfaces conducting the insulator, whereby adhesion between the semiconductor substrate and the insulator is so improved that separation can be prevented.

Accordingly, an object of the present invention is to provide a press contact type semiconductor device which can improve the shape of an insulator and readily position cathode and anode heat compensators, with no occurrence of biting or separation in molding and excellent heat dissipation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1.

Figure 1:
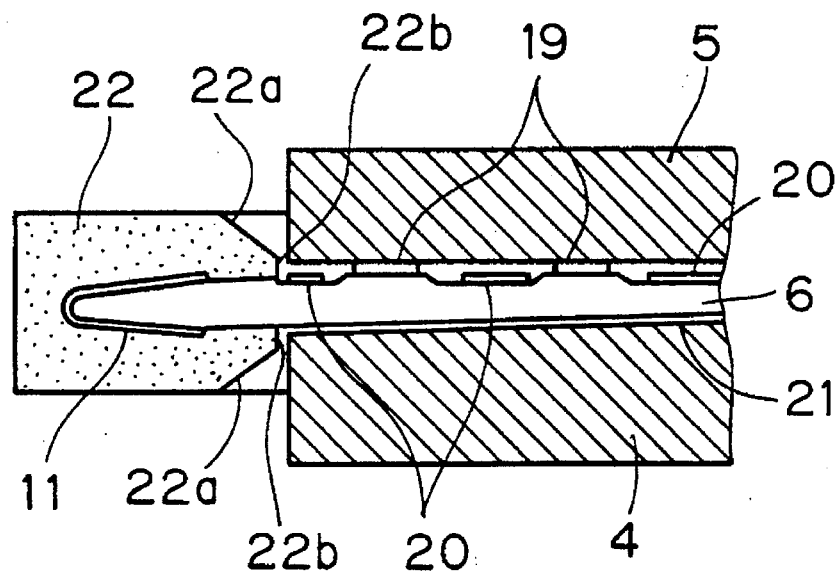
FIG. 1 is a sectional view showing a first embodiment of the present invention.

FIG. 1 is a partially fragmented sectional view showing an embodiment of a press contact type semiconductor device according to the present invention. Referring to FIG. 1, numeral 4 denotes an anode heat compensator, numeral 5 denotes a cathode heat compensator, numeral 6 denotes a semiconductor substrate, numerals 19 and 20 denote a cathode electrode layer and a gate electrode layer which are formed on the surface of the semiconductor substrate 6 respectively, numeral 21 denotes an anode electrode layer which is formed on the back surface of the semiconductor substrate 6, numeral 22 denotes an insulator consisting of silicone rubber or the like, and numeral 11 denotes an insulating varnish. The semiconductor substrate 6 is provided with a P-N junction in its interior and its outer peripheral edge is insulated by the insulating varnish 11, while high voltage resistance is attained by the insulator 22.

As shown in FIG. 1, the outer peripheral edge of the semiconductor substrate 6 is cut by bevelling, and insulated by the insulating varnish 11 after a crush layer is removed by etching, while the insulator 22 is further annularly formed. The insulator 22 is provided on its inner periphery with a tapered portion 22a along the inner peripheral direction and a vertical portion 22b which is continuous to the tapered portion 22a. The height of the vertical portion 22b is 0.1 mm, for example, and its angle is allowed in a range of 0° to 5° with respect to the vertical direction. The angle of the tapered portion 22a is set at about 30° with respect to the vertical direction, for example.

According to this embodiment, the vertical portion 22b reliably positions the anode heat compensator 4 and the cathode heat compensator 5, no biting is caused, and resistance in mold releasing is relaxed by the tapered portion 22a also in molding of the insulator 22, so that the insulator 22 is not separated along a bonded surface of the semiconductor substrate 6.

Embodiment 2

Figure 2:
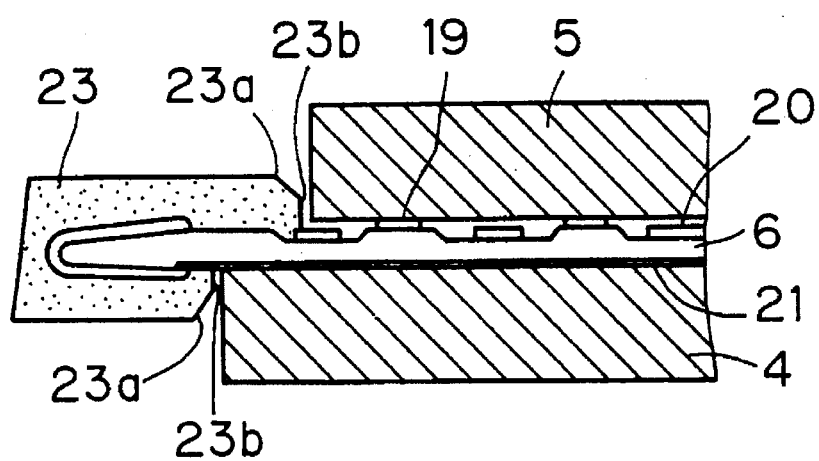
FIG. 2 is a sectional view showing a second embodiment of the present invention.

FIG. 2 is a sectional view showing a second embodiment of the present invention. Referring to FIG. 2, numerals which are identical to those in FIG. 1 denote the same or corresponding portions. Numeral 23 denotes an insulator which is annular similarly to the embodiment 1, while its inner peripheral diameter is rendered larger on the side of an anode electrode layer 21 as compared with the side of a cathode electrode layer 19. Further, a vertical portion 23b is formed on the inner periphery of the insulator 23 in continuation to a tapered portion 23a along the inner peripheral direction.

According to this embodiment, the diameter of the vertical portion 23b of the insulator 23 is rendered larger on the side of the anode electrode layer 21 as compared with the side of the cathode electrode layer 19, whereby both of an anode heat compensator 4 which is increased in diameter for the purpose of heat dissipation and a cathode heat compensator 5 which is smaller in diameter than the anode heat compensator 4 can be reliably aligned with each other.

Further, resistance in mold releasing is relaxed by formation of the tapered portion 23a, whereby an insulator 22 is not separated along a bonded surface of a semiconductor substrate 6.

Further, it is possible to reduce thermal resistance and improve heat dissipation by increasing the diameter of the anode heat compensator 4 by at least 5% as compared with that of the cathode heat compensator 5.

Embodiment 3

Figure 3:
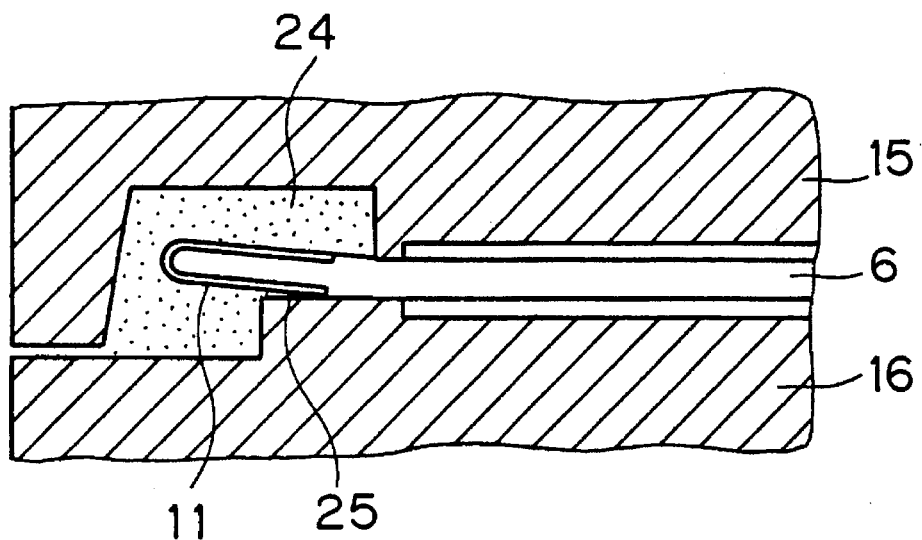
FIG. 3 is a sectional view showing a problem in a fabrication process of molding the structure of an insulator.

FIG. 3 is a sectional view showing a problem in a fabrication process for molding a structure of an insulator 24. When the inner diameter of the insulator 24 is reduced and increased on an upper surface and a lower surface of a semiconductor substrate 6 respectively, the semiconductor substrate 6 must not be cracked by pressures of molds 15 and 16 so that no flash 25 is caused by flowing of an insulator 24 into a clearance between the mold 16 and the semiconductor substrate 6 as shown in FIG. 3.

Figure 4:
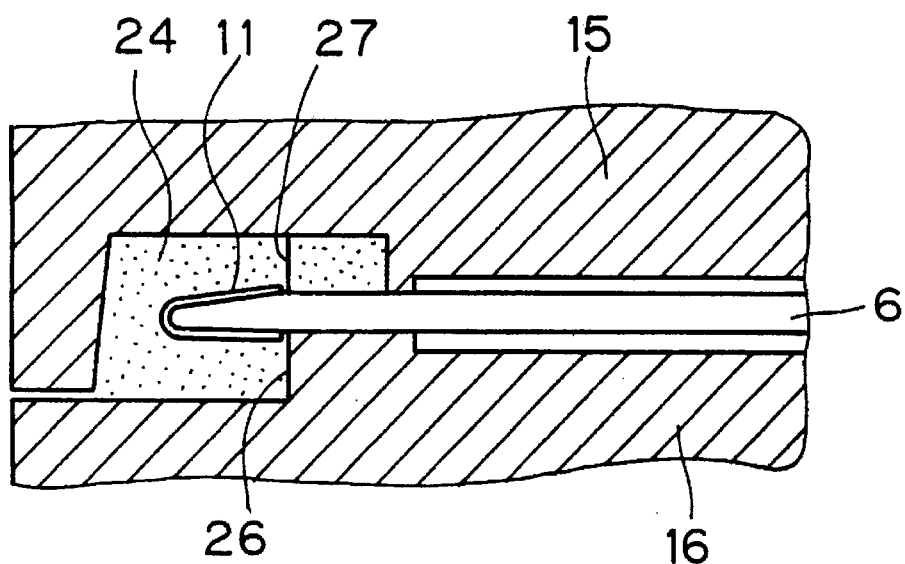
FIG. 4 is a sectional view showing a third embodiment of the present invention.

FIG. 4 is a sectional view showing a third embodiment. As shown in FIG. 4, a diametrically projecting presser portion 27 is formed on an upper mold 15 so that an end surface of the presser portion 27 is aligned with that of a presser portion 26 provided on the lower mold 16, for pressing a semiconductor substrate 6 in several portions.

Figure 5A:
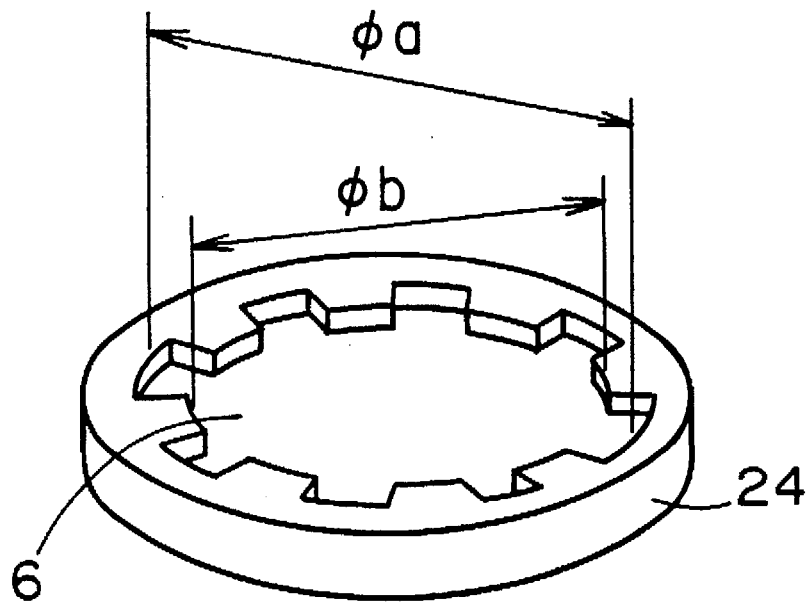
FIGs. 5A and 5B are a perspective view and a sectional view showing the third embodiment of the present invention respectively.
Figure 5B:
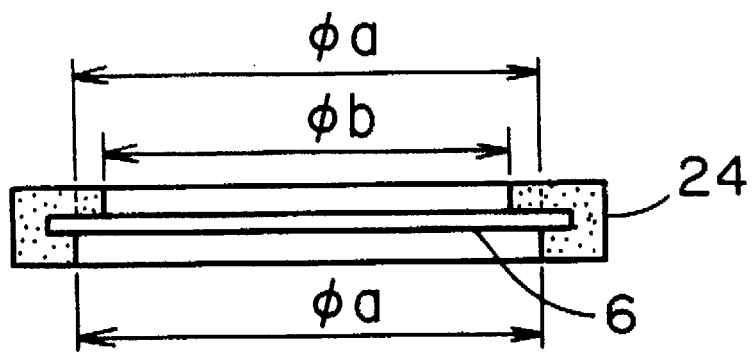

FIG. 5A is a perspective view showing an insulator 24 which is molded through the molds 15 and 16 shown in FIG. 4, and FIG. 5B is a sectional view of this insulator 24. Referring to FIGS. 5A and 5B, an inner diameter $\phi a$ of the insulator 24 on an upper major surface side of the semiconductor substrate 6, which is identical to the inner diameter $\phi a$ of the insulator 24 on the lower major surface side of the semiconductor substrate 6, is formed by the presser portion 27 shown in FIG. 4, while another inner diameter $\phi b$ of the insulator 24 on the lower major surface side of the semiconductor substrate 6 is defined by a clearance of the presser portion 27 shown in FIG. 4, to position a cathode heat compensator 5.

As hereinabove described, it is possible to increase the anode heat compensator 4 and improve heat dissipation by molding the insulator 24 and to correctly execute positioning of the anode heat compensator 4 and the cathode heat compensator 5 due to no occurrence of a flash 25, with neither half contact nor biting of the insulator 24 by the cathode and anode heat compensators 5 and 4. Further, it is possible to prevent separation in the bonded surface in molding by forming the tapered portion which is along the inner peripheral direction and the vertical portion which is continuous to the tapered portion on the inner periphery of the insulator 24.

Embodiment 4

Figure 6A:
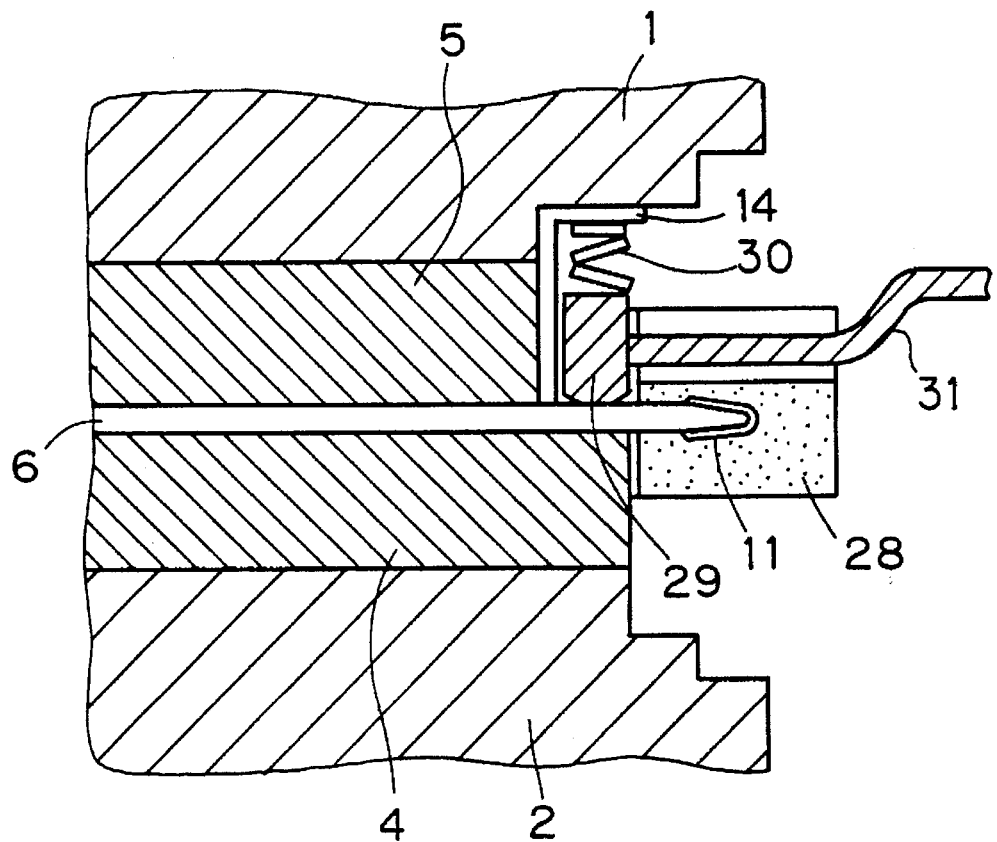
FIGS. 6A and 6B are a sectional view and a perspective view showing a fourth embodiment of the present invention respectively.
Figure 6B:
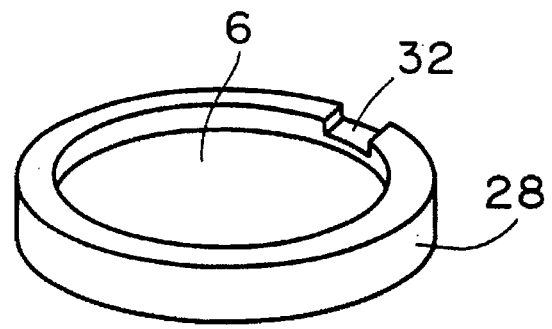

FIGS. 6A and 6B show a fourth embodiment. In these drawings, FIG. 6A is a partially fragmented sectional view showing a press contact type semiconductor device of an outer peripheral ring gate structure, and FIG. 6B is a perspective view showing a semiconductor substrate and an insulator which is formed on the outer periphery of this semiconductor substrate. Referring to FIGS. 6A and 6B, numerals which are identical to those in FIG. 1 denote the same or corresponding portions. Numeral 1 denotes a cathode copper block, numeral 2 denotes an anode copper block, numeral 28 denotes an insulator which is provided with a concave portion 32, numeral 29 denotes a ring gate electrode, numeral 30 denotes a spring, and numeral 31 denotes a gate lead which is electrically connected to the ring gate electrode 29.

The insulator 28 is provided with the concave portion 32 so that the gate lead 31 is positioned in the concave portion 32, whereby the gate lead 31 is not in contact with the insulator 28 in assembling so that correct positioning can be performed without breaking the insulator 28 or inhibiting the positioning.

Further, it is possible to improve mold releasability in molding for preventing separation of the insulator 28 along a bonded surface of a semiconductor substrate 6 by forming a tapered portion along an inner peripheral direction and a vertical portion which is continuous to the tapered portion on the inner periphery of the insulator 28.

Embodiment 5

Figure 7:
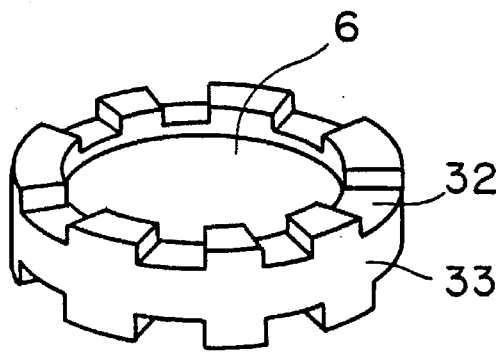
FIG. 7 is a perspective view showing a fifth embodiment of the present invention.

FIG. 7 is a perspective view showing a fifth embodiment of the present invention. Referring to FIG. 7, numeral 33 denotes an insulator which is provided with a plurality of concave portions 32.

Heat which is generated in a semiconductor substrate 6 in an electrical operation of a press contact type semiconductor device is transmitted to the insulator 33, to be stored therein. However, this heat is efficiently dissipated by formation of the plurality of concave portions 32, while the amount of the insulator 33 can be reduced to reduce the cost according to this embodiment.

Figure 8A:
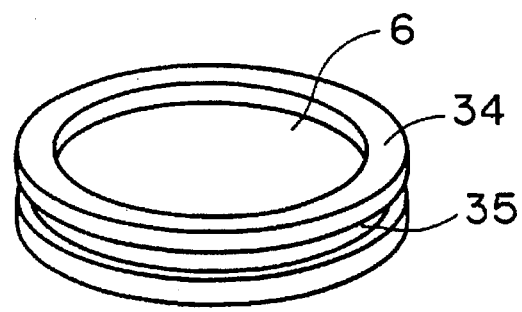
FIGS. 8A and 8B are a perspective view and a sectional view showing a modification of the first embodiment of the present invention respectively.
Figure 8B:
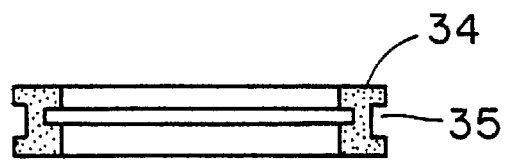

In consideration of heat dissipation, a groove 35 may be formed on an outer peripheral side surface of an insulator 34, as shown in a perspective view and a sectional view of FIGS. 8A and 8B. Due to formation of the groove 35, not only the heat dissipation is improved but the insulator 34 is saved, the cost is reduced, the creeping distance is lengthened and the withstand voltage property is improved.

Figure 9:
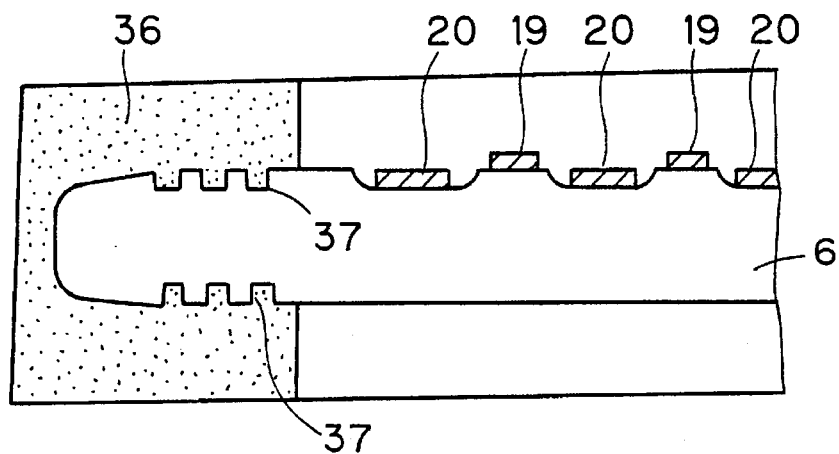
FIG. 9 is a sectional view showing a further embodiment of the present invention.
Figure 10:
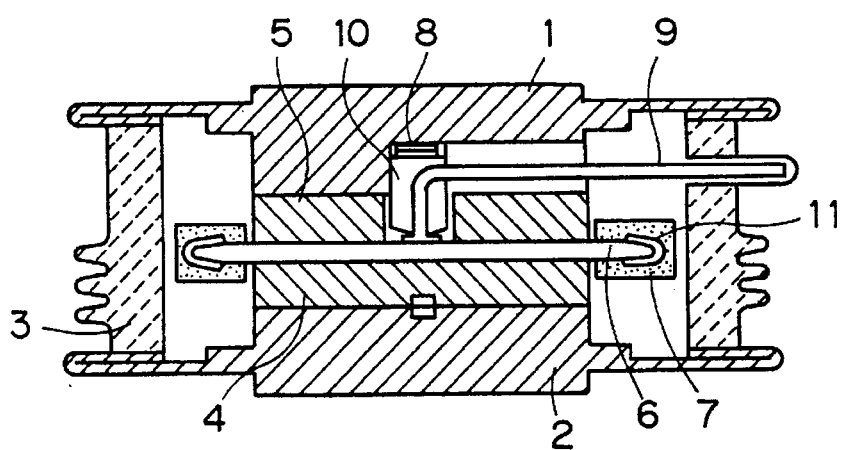
FIG. 10 is a sectional view showing a conventional press contact type semiconductor device.
Figure 11:
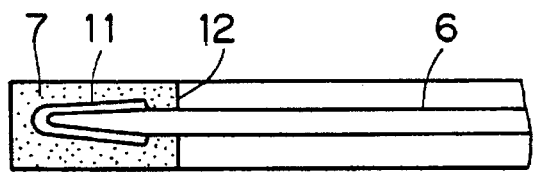
FIG. 11 is a sectional view showing the shape of an insulator in the conventional press contact type semiconductor device.
Figure 12:
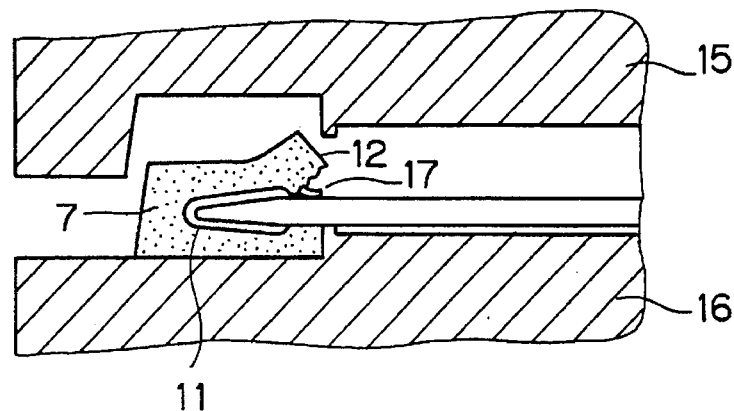
FIG. 12 is a sectional view showing a problem of the insulator in the conventional press contact type semiconductor device.
Figure 13:
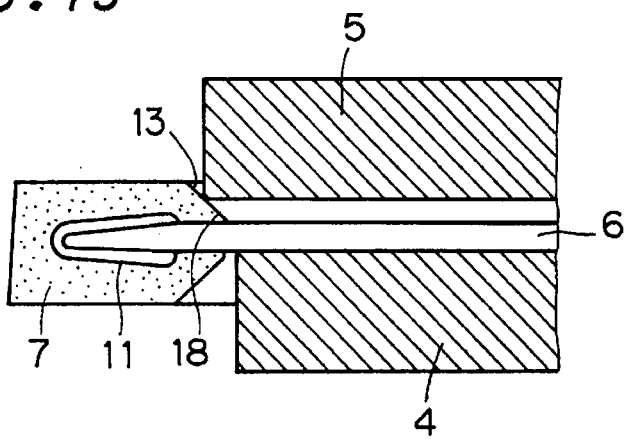
FIG. 13 is a sectional view showing another problem of the insulator in the conventional press contact type semiconductor device.
Figure 14:
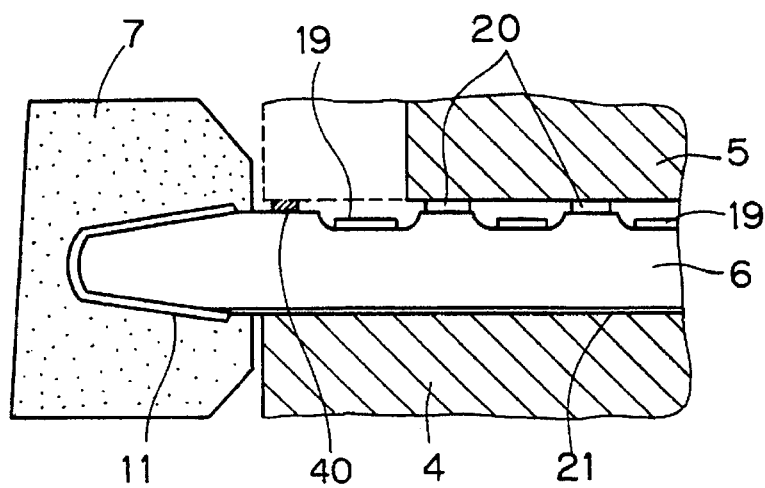
FIG. 14 is a sectional view showing still another problem of the insulator in the conventional press contact type semiconductor device.

When a plurality of ring-shaped grooves 37 which are coaxial with a semiconductor substrate 6 are formed on the outer peripheral surface of the semiconductor substrate 6 being in contact with an insulator 36 as shown in FIG. 9, the bonding area is increased and adhesion as well as separation resistance are improved. The ring-shaped grooves 37 are 500 μm in width and 30 μm in depth, for example.

As to the shape of each of the insulators 33, 34 and 36 shown in FIGS. 7, 8A and 8B and 9, it is possible to improve mold releasability in molding and to prevent the separation of the insulators 33, 34, or 36 along the bonded surface of the semiconductor substrate 6 by forming the tapered portion along the inner peripheral direction and the vertical portion which is continuous to the tapered portion on the inner periphery.

The shapes of the insulators 33 and 34 shown in FIGS. 7, 8A and 8B and the ring-shaped grooves 37 shown in FIG. 9 may also be employed in the embodiments 1 and 2, to attain similar effects.

While the invention has been shown and described in detail, the foregoing description is in all aspects illustrative and not restrictive. It is therefore understood that numerous modifications and variations can be devised without departing from the scope of the invention.

What is claimed is:

1. A press contact type semiconductor device, comprising:
    a semiconductor substrate, being provided with a P-N junction in its interior, having first and second major surfaces;
    a ring-shaped insulator being formed along an edge of the overall periphery and said first and second major surfaces of said semiconductor substrate;
    a first heat compensator being in contact with said first major surface; and
    a second heat compensator being in contact with said second major surface,
    said insulator being provided on its inner periphery with an inner peripheral tapered portion and a vertical portion, being continuous to said tapered portion, forming an inner peripheral diameter and being substantially perpendicular to said semiconductor substrate.

2. The press contact type semiconductor device in accordance with claim 1, wherein the width of said vertical portion is about 0.1 mm.

3. The press contact type semiconductor device in accordance with claim 2, wherein said vertical portion is at an angle of within about 5° with respect to normal directions of said first and second major surfaces.

4. The press contact type semiconductor device in accordance with claim 3, wherein said tapered portion is inclined at an angle of about 30° with respect to normal directions of said first and second major surfaces.

5. The press contact type semiconductor device in accordance with claim 1, wherein the inner peripheral diameter of a portion of said insulator along said first major surface is larger than that of a portion along said second major surface.

6. A press contact type semiconductor device, comprising:
    a semiconductor substrate, being provided with a P-N junction in its interior, having first and second major surfaces;
    a ring-shaped insulator being formed along an edge of the overall periphery and said first and second major surfaces of said semiconductor substrate;
    a first heat compensator being in contact with said first major surface; and
    a second heat compensator being in contact with said second major surface,
    the inner peripheral diameter of a portion of said insulator along said first major surface being larger than that of a portion along said second major surface.

7. The press contact type semiconductor device in accordance with claim 1, wherein at least one concave portion is formed on the surface of a portion of said insulator being formed along said first major surface and/or said second major surface.

8. The press contact type semiconductor device in accordance with claim 6, wherein at least one concave portion is formed on the surface of a portion of said insulator being formed along said first major surface and/or said second major surface.

9. The press contact type semiconductor device in accordance with claim 1, wherein a ring-shaped concave portion is formed on the overall periphery of the surface of a portion of said insulator being formed along said edge.

10. The press contact type semiconductor device in accordance with claim 6, wherein a ring-shaped concave portion is formed on the overall periphery of the surface of a portion of said insulator being formed along said edge.

11. The press contact type semiconductor device in accordance with claim 6, wherein a concave portion having a diameter being substantially identical to the inner peripheral diameter of a portion being formed on said first major surface is formed on the inner periphery of a portion of said insulator being formed along said second major surface.

12. The press contact type semiconductor device in accordance with claim 6, wherein the outer diameter of said first heat compensator is rendered larger than that of said second heat compensator by at least 5%.

13. A press contact type semiconductor device, comprising:
    a semiconductor substrate, being provided with a P-N junction in its interior, having first and second major surfaces;
    a ring-shaped insulator being formed along an edge of the overall periphery and said first and second major surfaces of said semiconductor substrate;

a first heat compensator being in contact with said first major surface; and a second heat compensator being in contact with said second major surface, a ring-shaped groove being formed coaxially with said semiconductor substrate in portions of said first and second major surfaces contacting said insulator.

14. The press contact type semiconductor device in accordance with claim 13, wherein said ring-shaped groove is about 50 μm in width and about 30 μm in depth.

15. A press contact type semiconductor device, comprising:

a semiconductor substrate, being provided with a P-N junction in its interior, having first and second major surfaces;

a ring-shaped insulator being formed along an edge of the overall periphery and said first and second major surfaces of said semiconductor substrate;

a first heat compensator being in contact with said first major surface; and a second heat compensator being in contact with said second major surface, at least one concave portion being formed on the surface of a portion of said insulator being formed along said first major surface and/or said second major surface.

16. A press contact type semiconductor device, comprising:

a semiconductor substrate, being provided with a P-N junction in its interior, having first and second major surfaces;

a ring-shaped insulator being formed along an edge of the overall periphery and said first and second major surfaces of said semiconductor substrate;

a first heat compensator being in contact with said first major surface; and a second heat compensator being in contact with said second major surface, a ring-shaped concave portion being formed on the overall periphery of the surface of a portion of said insulator being formed along said edge.

17. The press contact type semiconductor device in accordance with claim 1, wherein a ring-shaped groove is formed coaxially with said semiconductor substrate in portions of said first and second major surfaces contacting said insulator.

18. The press contact type semiconductor device in accordance with claim 6, wherein a ring-shaped groove is formed coaxially with said semiconductor substrate in portions of said first and second major surfaces contacting said insulator.

19. The press contact type semiconductor device in accordance with claim 15, wherein a ring-shaped groove is formed coaxially with said semiconductor substrate in portions of said first and second major surfaces contacting said insulator.

20. The press contact type semiconductor device in accordance with claim 16, wherein a ring-shaped groove is formed coaxially with said semiconductor substrate in portions of said first and second major surfaces contacting said insulator.

* * * * *